United States Patent
Li et al.

(10) Patent No.: US 9,143,275 B2
(45) Date of Patent: Sep. 22, 2015

(54) METHODS AND APPARATUS TO IDENTIFY THE ACCESSIBILITY OF FEMTO-BASE STATIONS IN COMMUNICATION SYSTEMS

(75) Inventors: Ying Li, Garland, TX (US); Zhouyue Pi, Richardson, TX (US); Farooq Khan, Allen, TX (US); Baowei Ji, Plano, TX (US)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 1439 days.

(21) Appl. No.: 12/462,023

(22) Filed: Jul. 28, 2009

(65) Prior Publication Data
US 2010/0153816 A1 Jun. 17, 2010

Related U.S. Application Data

(60) Provisional application No. 61/201,911, filed on Dec. 16, 2008.

(51) Int. Cl.
| | |
|---|---|
| *H04M 1/66* | (2006.01) |
| *H04L 1/00* | (2006.01) |
| *H03M 13/09* | (2006.01) |
| *H04J 13/10* | (2011.01) |

(Continued)

(52) U.S. Cl.
CPC ............ H04L 1/0061 (2013.01); H04L 1/0072 (2013.01); *H03M 13/09* (2013.01); *H04J 13/10* (2013.01); *H04L 5/0026* (2013.01); *H04L 5/0048* (2013.01); *H04L 25/03866* (2013.01); *H04L 27/2655* (2013.01); *H04L 2001/0093* (2013.01)

(58) Field of Classification Search
CPC ..... H04W 24/10; H04W 36/34; H04W 28/18; H04W 36/0061; H04W 36/08; H04W 52/0206; H04W 28/12; H04W 72/04; H04W 8/186
USPC ........... 455/411, 435.1, 435.2, 444, 448, 449, 455/17, 500, 524, 526, 63.2, 552.1
See application file for complete search history.

(56) References Cited

U.S. PATENT DOCUMENTS

| | | |
|---|---|---|
| 6,201,811 B1 | 3/2001 | Larsson et al. |
| 7,289,483 B1 | 10/2007 | Lim |

(Continued)

FOREIGN PATENT DOCUMENTS

| | | |
|---|---|---|
| EP | 1755299 A2 | 2/2007 |
| WO | WO 02/093296 A2 | 11/2002 |

(Continued)

OTHER PUBLICATIONS

International Search Report dated Jul. 29, 2010 in connection with International Patent Application No. PCT/KR2009/007529.

(Continued)

*Primary Examiner* — Kwasi Karikari

(57) ABSTRACT

A system and method for identifying the accessibility of femto base stations in a communication system. The system and method includes a plurality of macro base stations, open-access femto base stations and femto base stations with different subscriber groups. At least one of the base stations includes a transmitter configured to apply a base station identifier, such as a closed subscription group identifier, as a cyclic redundancy check (CRC) mask to XOR (exclusive OR) the CRC of a broadcast channel communication or an input to generate a scrambling sequence to the broadcast channel communication.

21 Claims, 8 Drawing Sheets

(51) Int. Cl.
  *H04L 5/00* (2006.01)
  *H04L 25/03* (2006.01)
  *H04L 27/26* (2006.01)

(56) References Cited

U.S. PATENT DOCUMENTS

| | | | |
|---|---|---|---|
| 7,697,689 B2 * | 4/2010 | Collum et al. | 380/270 |
| 2005/0058112 A1 | 3/2005 | Lahey et al. | |
| 2009/0060088 A1 * | 3/2009 | Callard et al. | 375/299 |
| 2009/0197542 A1 * | 8/2009 | Buckley et al. | 455/70 |
| 2011/0269460 A1 * | 11/2011 | Dalsgaard et al. | 455/435.1 |

FOREIGN PATENT DOCUMENTS

| | | |
|---|---|---|
| WO | WO 2007/114638 A2 | 10/2007 |
| WO | WO 2008/041495 A1 | 4/2008 |

OTHER PUBLICATIONS

Written Opinion of the International Searching Authority dated Jul. 29, 2010 in connection with International Patent Application No. PCT/KR2009/007529.

Extended European Search Report dated Apr. 3, 2014 in connection with European Patent Application No. 09833634.0; 8 pages.

\* cited by examiner

METHODS AND APPARATUS TO IDENTIFY THE ACCESSIBILITY OF FEMTO-BASE STATIONS IN COMMUNICATION SYSTEMS

CROSS-REFERENCE TO RELATED APPLICATION(S) AND CLAIM OF PRIORITY

The present application is related to U.S. Provisional Patent No. 61/201,911, filed Dec. 16, 2008, entitled "METHODS AND APPARATUS TO IDENTIFY THE ACCESSIBILITY OF FEMTO BASE STATIONS IN COMMUNICATION SYSTEMS". Provisional Patent No. 61/201,911 is assigned to the assignee of the present application and is hereby incorporated by reference into the present application as if fully set forth herein. The present application hereby claims priority under 35 U.S.C. §119(e) to U.S. Provisional Patent No. 61/201,911.

TECHNICAL FIELD OF THE INVENTION

The present application relates generally to femtocell devices and, more specifically, to identifying accessibility of femto base stations in a wireless communications system.

BACKGROUND OF THE INVENTION

Femtocell devices are small base stations designed for home or small business use. Femtocell devices operate in a small range and are designed to provide cellular coverage in the home or office. The typical femtocell device connects to a Security Gateway or Softswitch over an Interent Protocol (IP) connection, such as a Digital Subscriber Line (DSL) or broadband cable connection. The Security Gateway or Softswitch is intended to plug into the DSL or cable modem using a standard Ethernet cable.

Femto Base Stations (FBSs) can be open or closed. An open FBS accepts any compatible mobile device (e.g., accepts communications to and from any compatible cell phone, PDA, and the like). A closed FBS requires that the mobile device be authorized to access through the FBS.

SUMMARY OF THE INVENTION

A mobile station capable of communicating with a plurality of base stations is provided. The mobile station includes a receiver configured to receive a broadcast channel communication from at least one of the plurality of base stations. The mobile station also includes a main processor. The main processor is configured to extract a base station identifier from at least one of cyclic redundancy check (CRC) masks applied to the CRC of the broadcast channel communication or a scrambling sequence applied to the broadcast channel communication. The main processor further is configured to use the base station identifier to determine if the mobile station is authorized to access the at least one of the plurality of base stations.

A wireless communications network capable of communicating with a plurality of mobile stations is provided. The network includes a plurality of base stations. At least one of the base stations includes a base transceiver subsystem configured to apply a base station identifier as one of: a cyclic redundancy check (CRC) mask to the CRC of a broadcast channel communication, or an input of the generator of a scrambling sequence to the broadcast channel communication. The base station identifier distinguishes respective ones of the plurality of base stations.

A method for distinguishing the base station types and distinguishing the accessibility of base stations is provided, where the base stations include macro base stations, open-access femtocell base stations, femtocell base stations with different closed-subscriber-group identifiers (CSG IDs). The method includes applying a base station identification as a cyclic redundancy check (CRC) mask to the CRC of a broadcast channel communication. The method also includes transmitting the broadcast channel communication to at least one mobile station.

A method for distinguishing the base station types and distinguishing the accessibility of base stations is provided, where the base stations include macro base stations, open-access femtocell base stations, femtocell base stations with different closed-subscriber-group identifiers (CSG IDs). The method includes generating a scrambling sequence based on, at least in part, a value. The value corresponds to a least one of an indication of a macro base station, and indication of an open-based femto base station, and a closed subscriber group identifier (CSG ID). The method further includes applying the scrambling sequence to a broadcast channel communication and transmitting the broadcast channel communication to at least one mobile station.

A base station capable of communicating with a plurality of mobile stations is provided. The base station includes a base transceiver subsystem configured to apply a closed subscription group identifier as one of: a cyclic redundancy check (CRC) mask to a broadcast channel communication, and a scrambling sequence to the broadcast channel communication.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

Figure 1:
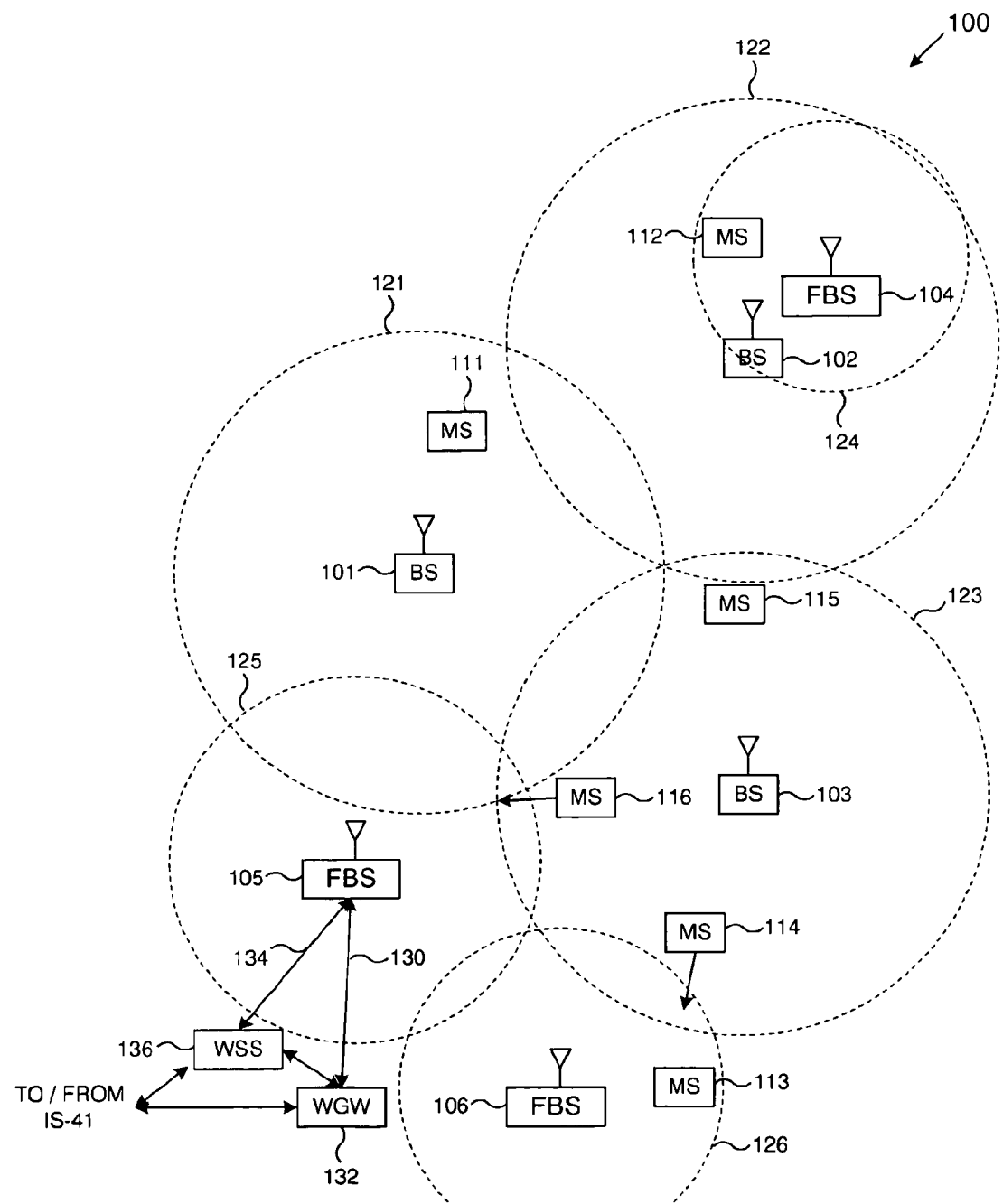
FIG. 1 illustrates exemplary wireless network 100 according to embodiments of the present disclosure.

FIGS. 1 through 8, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless network.

As described in IEEE 802.16m System Requirements, a Femtocell is a low power Base Station (BS). Femtocells are typically installed by a subscriber in a home or small office/home office to provide access to closed or open group of users as configured by the subscriber and/or the access provider. Femtocell BS's typically operate in licensed spectrum and may use the same or different frequency as macro-cells and use broadband connection such as cable or DSL for backhaul. The mobile station (MS)'s using access in a femtocell are typically stationary or moving at low (i.e., pedestrian) speed.

Femtocells are different from macro cells. Embodiments of the present disclosure provide a system and method to identify femto base stations as well as to distinguish femtocells from macro cells. Further, embodiments of the present disclosure distinguish open-access femtocell (which allow any compatible MS to access) from the Closed Subscriber Group (CSG) femtocell (which allows only authorized MS's, i.e., the MS's belonging to this femtocell, to access), since some operations, such as, but not limited to, handover, paging, and the like, will be different for femtocells and macro cells, and for open-access and CSG femtocells. For example, the MS with high speed may not need to handover to any femtocells, the open-access femto base stations may accept the handover requests from MS while the MS that does not belong to a CSG femtocell may not need to send handover request to that femtocell, and so forth.

Embodiments of the present disclosure provide a system and method to identify femtocell base stations with different CSG IDs. The femtocell base station is configured to inform a mobile station regarding an identification of CSG with the CSG ID. Therefore, even if the MS knows the femtocell is of a CSG type, the MS also is informed whether this femtocell is closed for or authorized for the MS to access, i.e., the MS knows whether the MS can access this CSG or not. In some embodiments, the MS is configured to store a list of the CSG femtocells that the MS can access. As such when the MS receives the CSG ID of a CSG femtocell, the MS checks the received CSG ID with the list of the accessible femtocells. If the received CSG ID is in the list of the MS's list of accessible femtocells, the MS knows the CSG is accessible. Hence, a CSG ID of the CSG femtocell is sent to MS's via wireless communication signaling. To make the list of accessible CSG femtocells of a MS short, in some embodiments, multiple CSG femtocells share a common CSG ID if these CSG femtocells have the same set of MS's allowed to access them. For example, if a user subscribes via a chain of coffee shops to access the closed femtocells at each coffee shop, the CSG femtocells for the coffee shops will share the common CSG ID.

In some examples, different groups of preambles are used to distinguish femtocells from macro cells. The preambles are divided into two groups, one for femtocells, another for macro cells. In the case of a large number of femtocells and insufficient preambles, the preambles are dynamically allocated. In some examples, one bit in least significant bit (LSB) that is a 24 programmable bit segment of the base station ID is used to distinguish femtocell and macro cell, and to use another bit in LSB to distinguish femtocell open-access mode and CSG mode. This approach will increase the overhead of Broadcast Channel (BCH), which is very expensive. In additional and alternative examples, different scrambling sequences and/or different CRCs (cyclic redundancy check) to differentiate femto BS from macro BS's, and to differentiate open-access femto BS and CSG femto BS.

FIG. 1 illustrates exemplary wireless network 100 according to embodiments of the present disclosure. The embodiment of wireless network 100 illustrated in FIG. 1 is for illustration only. Other embodiments of the wireless network 100 could be used without departing from the scope of this disclosure.

Wireless network 100 comprises a plurality of cells 121-126, each containing one of the Base Stations (BS), BS 101, BS 102, or BS 103 or Femto Base Stations (FBS), FBS 104, FBS 105 or FBS 106. Base stations 101-103 communicate with a plurality of mobile stations (MS) 111-116 over code division multiple access (CDMA) channels), Orthogonal Frequency Division Multiple Access (OFDMA), or any other communications standard as is known in the art. In some embodiments, mobile stations 111-116 are capable of receiving data traffic and/or voice traffic on two or more CDMA channels simultaneously. Mobile stations 111-116 may be any suitable wireless devices (e.g., conventional cell phones, PCS handsets, personal digital assistant (PDA) handsets, portable computers, telemetry devices) that are capable of communicating with base stations 101-103 via wireless links.

Dotted lines show the approximate boundaries of cells 121-123 in which base stations 101-103 are located. The cells are shown approximately circular for the purposes of illustration and explanation only. It should be clearly understood that the cells may have other irregular shapes, depending on the cell configuration selected and natural and man-made obstructions.

As is well known in the art, each of cells 121-123 is comprised of a plurality of sectors, where a directional antenna coupled to the base station illuminates each sector. The embodiment of FIG. 1 illustrates the base station in the center of the cell. Alternate embodiments may position the directional antennas in corners of the sectors. The system of the present disclosure is not limited to any particular cell configuration.

In one embodiment of the present disclosure, each of BS 101, BS 102 and BS 103 comprises a base station controller (BSC) and one or more base transceiver subsystem(s) (BTS). Base station controllers and base transceiver subsystems are well known to those skilled in the art. A base station controller is a device that manages wireless communications resources, including the base transceiver subsystems, for specified cells within a wireless communications network. A base transceiver subsystem comprises the RF transceivers, antennas, and other electrical equipment located in each cell site. This equipment may include air conditioning units, heating units, electrical supplies, telephone line interfaces and RF transmitters and RF receivers. For the purpose of simplicity and clarity in explaining the operation of the present disclosure, the base transceiver subsystems in each of cells 121, 122, 123 and the base station controller associated with each base transceiver subsystem are collectively represented by BS 101, BS 102, and BS 103, respectively.

In some embodiments, BS 101, BS 102 and BS 103 transfer voice and data signals between each other and the public switched telephone network (PSTN) (not shown), or any IS-41 communication network as is known in the art, via communication line (not shown) and mobile switching center (MSC) (not shown). The communication line may be any suitable connection means, including a T1 line, a T3 line, a fiber optic link, a network packet data backbone connection, or any other type of data connection. The communication line links each vocoder in the BSC with switch elements in the MSC. The connections on communication line may transmit analog voice signals or digital voice signals in pulse code modulated (PCM) format, Internet Protocol (IP) format, asynchronous transfer mode (ATM) format, or the like.

The MSC is a switching device that provides services and coordination between the subscribers in a wireless network and external networks, such as the IS-41, PSTN, or Internet. The MSC is well known to those skilled in the art. In some embodiments of the present disclosure, communications line may be several different data links where each data link couples one of BS 101, BS 102, or BS 103 to the MSC.

The wireless network 100 includes a femto-cell base station 124-126. Each FBS 124-126 includes components analogous to those found in macro base stations BS 101, BS 102 and BS 103. As such, FBS 124, FBS 125 and FBS 126 each comprises a femto base station controller (FBSC) and one or more femto base transceiver subsystem(s) (FBTS). Each of FBS 124, FBS 125 and FBS 126 communicates with mobile stations in its served area using wireless fidelity, IS-95, CDMA or any other cellular communications standard.

Voice and data signals are transferred between the FBS 104, FBS 105 and FBS 106 and the IS-41 network (e.g., PSTN) via communications lines, wireless gateway and wireless soft switches. For example, Voice signals are transferred between the FBS 105 and the IS-41 network via communication line 130, Wireless Gateway (WGW) 132. Data signals are transferred between the FBS 105 and the IS-41 network via communication line 134 and Wireless Soft Switch (WSS) 136. The WGW 132 and WSS 136 are coupled via a backhaul connection (not shown), e.g., the IS-41, to the MSC. The WGW 132 provides a bearer path between FBS 105 and the MSC via the IS-41. The WSS 136 provides a signaling path FBS 105 and WGW 132 as well as to the MSC via the IS-41.

A dotted line shows the approximate boundaries of cells 124-126 in which FBS 104, FBS 105 and FBS 106 are located. The cell is shown approximately circular for the purposes of illustration and explanation only. It should be clearly understood that the cell may have an irregular shape, depending on the cell configuration selected and natural and man-made obstructions.

In the exemplary wireless network 100, MS 111 is located in cell 121 and is in communication with BS 101. MS 112 is located in cell 121 and cell 124 and is in communication with BS 102. MS 113 is located in cell 126, is in communication with FBS 106. MS 114 is located in cell 123, is in communication with BS 103 and is moving in the direction of cell 126, as indicated by the direction arrow proximate MS 114. At some point, as MS 114 moves into cell 126 and MS 114 will detect signals from FBS 106. MS 115 is located in cell 123 and is in communication with BS 103. MS 115 also is located close to the edge of cell 122. MS 116 is located in cell 123, is in communication with BS 103 and is moving in the direction of cell 121 and cell 125. At some point, as MS 116 moves into area covered by cell 121 and cell 125, MS 116 will detect signals from BS 101 and FBS 105 and a handoff will occur.

The handoff procedure transfers control of a call from a first cell to a second cell. A handoff may be either a "soft handoff" or a "hard handoff." In a "soft handoff" a connection is made between the mobile station and the base station in the second cell before the existing connection is broken between the mobile station and the base station in the first cell. In a "hard handoff" the existing connection between the mobile station and the base station in the first cell is broken before a new connection is made between the mobile station and the base station in the second cell.

When the strength of the pilot that is transmitted by a non-serving base station, or non-serving femto base station, and received and reported by a mobile station to a serving base station exceeds a threshold, the serving base station initiates a handoff process by signaling the mobile station and the target base station that a handoff is required. For example, BS 103 signals MS 114 and FBS 106 when the pilot signals transmitted by FBS 106 and received and reported by MS 114 to BS 103 exceed a threshold. BS 102 signals target FBS 106 by sending a communication via the MSC and the WSS 136 to FBS 106. In an additional example, if MS 114 is moving from FBS 106 to BS 103, when the strength of the pilot that is transmitted by BS 103 and received and reported by MS 114 to FBS 106 exceeds a threshold, FBS 106 initiates a handoff process by signaling MS 114 and the target BS 103 that a handoff is required. FBS 106 signals target BS 103 by sending a communication via the WSS 136 to the MSC to BS 103.

In another example, in an inter-frequency handoff, as MS 114 moves from cell 125 to cell 123, MS 114 conducts a Candidate Frequency Search (CFS). After the target base stations are identified, a report of the target base stations is reported by MS 114 to FBS 106, FBS 106 initiates a handoff process by signaling MS 114 and the target BS 103 that a handoff is required. FBS 106 signals target BS 102 by sending a communication via the WSS 136 to the MSC to BS 103.

As shown in FIG. 1, MS 112 is located in both cell 122 and cell 124. FBS 104 is a CSG FBS. Furthermore, MS 112 has not subscribed to FBS 104. Therefore, MS 112 is not authorized to access FBS 104. Accordingly, MS 112 is not in communication with FBS 104 and is only in communication with BS 102.

Additionally, MS 114 is moving from BS 103 towards FBS 106. FBS 106 is an open-access FBS. As MS 114 enters cell 126, MS 114 becomes aware of FBS 106 as MS 114 receives signaling from FBS 106. The signaling contains a base station identifier (e.g., base station identity, or some other value) for FBS 106 indicating that FBS 106 is an open FAP. Since FBS 106 is an open FAP, all compatible wireless devices, including MS 114, are authorized to access FBS 106. In some embodiments, a handoff occurs wherein communications between MS 114 and BS 103 are terminated and communications between MS 114 and FBS 106 are established. MS 114 may still be located within cell 123 and in communication with FBS 104.

Furthermore, MS 116 is moving from BS 103 towards FBS 105. FBS 105 is a closed FBS. Therefore, only authorized wireless devices are allowed to access FBS 105. For example, FBS 105 may be located in a Starbucks® and only individuals who have subscribed for access a FBS through Starbuck® are allowed to access FBS 105. A subscriber with MS 116 enters cell 125. MS 116 receives signaling from FBS 105. The signaling includes a Closed Subscriber Group (CSG) Identification (ID) for FBS 105. MS 116 recognizes the CSG ID for FBS 105 and a handoff of MS 116 from BS 103 to FBS 105 occurs.

Figure 2:
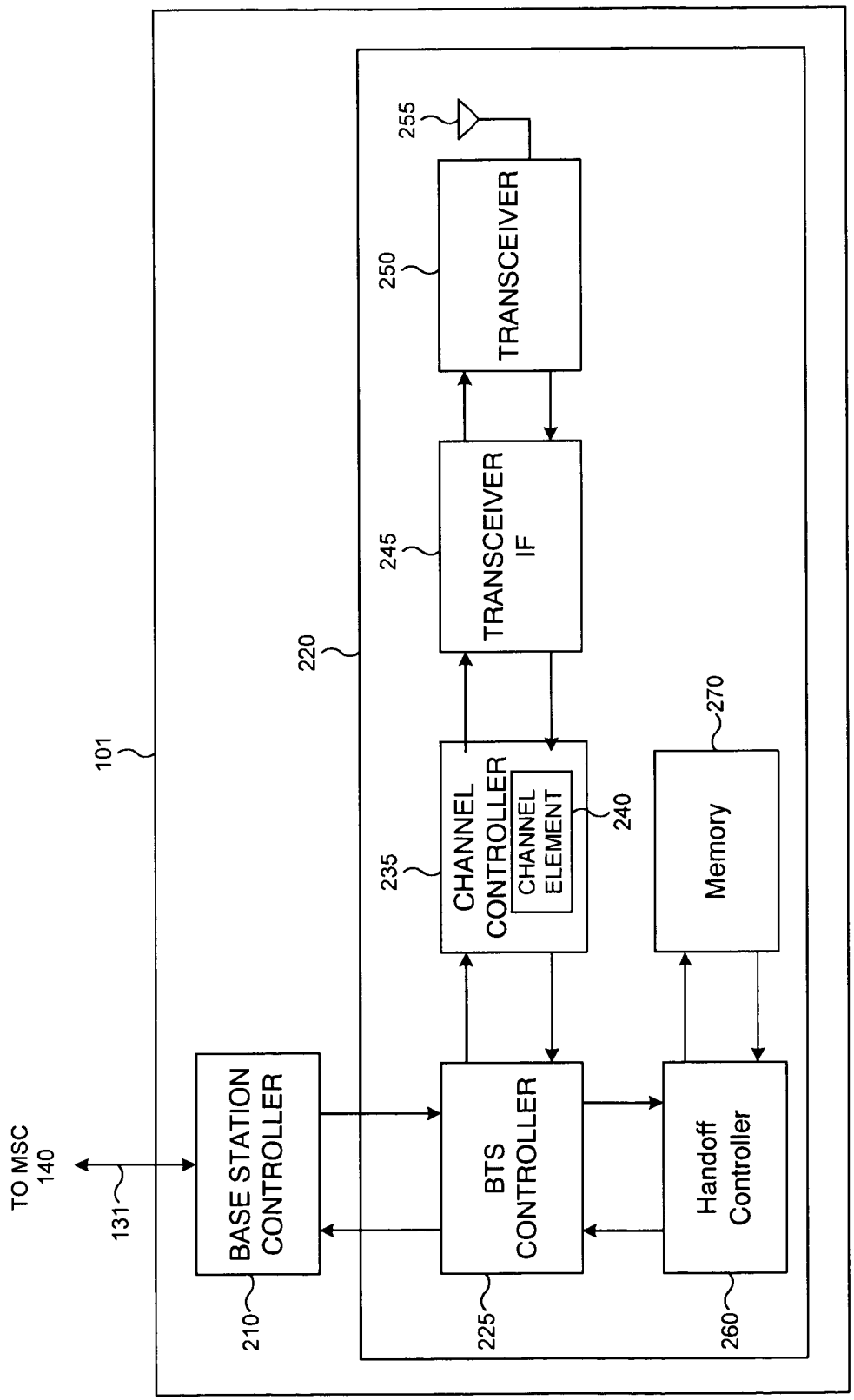
FIG. 2 illustrates exemplary base station 101 in greater detail according to one embodiment of the present disclosure.

FIG. 2 illustrates exemplary base station 101 in greater detail according to one embodiment of the present disclosure. The embodiment of base station 101 illustrated in FIG. 2 is for illustration only. Other embodiments of the base station 101 could be used without departing from the scope of this disclosure. It will be understood that although BS 101 is described for illustration and example only, descriptions can apply to BS 102 and BS 103 equally.

Base station 101 includes base station controller (BSC) 210 and base transceiver subsystem (BTS) 220. Base station controllers and base transceiver subsystems were described previously in connection with FIG. 1. BSC 210 manages the resources in cell site 121, including BTS 220. BTS 220 comprises BTS controller 225, channel controller 235, transceiver interface (IF) 245, RF transceiver unit 250, and antenna array 255. Channel controller 235 comprises a plurality of channel elements, including exemplary channel element 240. BTS 220 also comprises a handoff controller 260. The embodiment of handoff controller 260 and memory 270 included within BTS 220 is for illustration only. Handoff controller 260 and memory 270 can be located in other portions of BS 101 without departing from the scope of this disclosure.

BTS controller 225 includes processing circuitry and memory capable of executing an operating program that communicates with BSC 210 and controls the overall operation of BTS 220. Under normal conditions, BTS controller 225 directs the operation of channel controller 235, which contains a number of channel elements, including channel element 240, that perform bi-directional communications in the forward channels and the reverse channels. A forward channel refers to a channel in which signals are transmitted from the base station to the mobile station. A reverse channel refers to a channel in which signals are transmitted from the mobile station to the base station. In some embodiments, the channel elements communicate according to a code division multiple access (CDMA) protocol with the mobile stations in cell 121. In additional and alternative embodiments, the channel elements communicate according to a OFDMA protocol with the mobile stations in cell 121. Transceiver IF 245 transfers the bi-directional channel signals between channel controller 240 and RF transceiver unit 250.

Antenna array 255 transmits forward channel signals received from RF transceiver unit 250 to mobile stations in the coverage area of BS 101. Antenna array 255 also sends to transceiver 250 reverse channel signals received from mobile stations in the coverage area of BS 101. In some embodiments, antenna array 255 is a multi-sector antenna, such as a three-sector antenna in which each antenna sector is responsible for transmitting and receiving in a 120° arc of coverage area. Additionally, RF transceiver 250 may contain an antenna selection unit to select among different antennas in antenna array 255 during transmit and receive operations.

According to some embodiments, handoff controller 260 is capable of determining a list of candidate target base stations for handoff. Handoff controller 260 is configured to dynamically adjust a threshold parameter used in inter-frequency (i.e., different frequency) hard handoffs. Handoff controller 260 also is configured to dynamically adjust the threshold parameter used in intra-frequency (i.e., same frequency) hard handoffs. Handoff controller 260 is operable to store the threshold parameters and list of candidate target base stations in a memory 270.

Memory 270 can be any computer readable medium, for example, the memory 270 can be any electronic, magnetic, electromagnetic, optical, electro-optical, electro-mechanical, and/or other physical device that can contain, store, communicate, propagate, or transmit a computer program, software, firmware, or data for use by the microprocessor or other computer-related system or method. Memory 270 comprises a random access memory (RAM) and another part of memory 270 comprises a Flash memory, which acts as a read-only memory (ROM).

Figure 3:
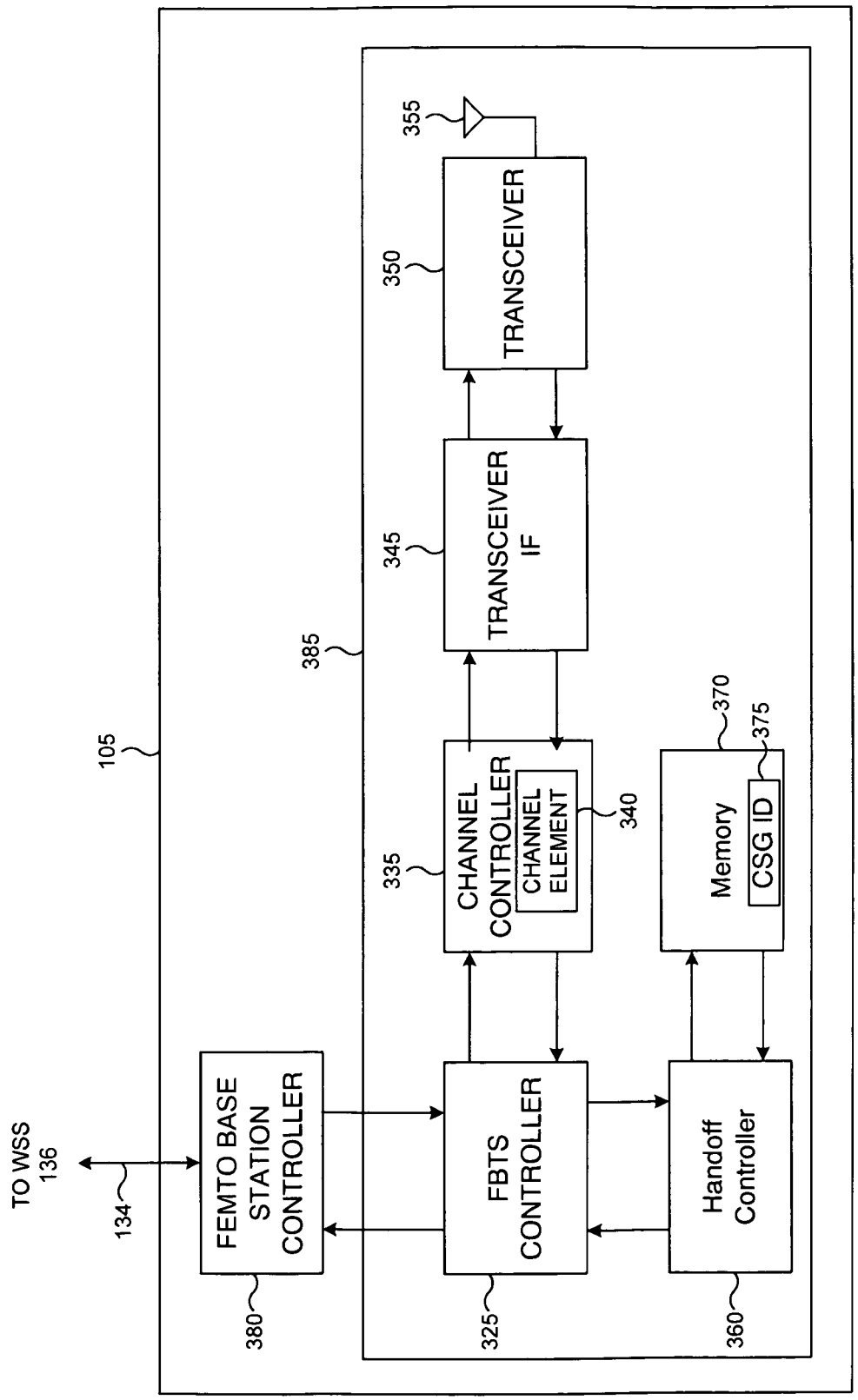
FIG. 3 illustrates exemplary femto base station 105 in greater detail according to one embodiment of the present disclosure.

FIG. 3 illustrates exemplary femto base station 105 in greater detail according to one embodiment of the present disclosure. The embodiment of femto base station 105 illustrated in FIG. 3 is for illustration only. Other embodiments of the femto base station 105 could be used without departing from the scope of this disclosure. It will be understood that although FBS 105 is described for illustration and example only, descriptions can apply to FBS 104 and FBS 106 equally.

Femto base station 105 includes femto base station controller (FBSC) 380 and femto base transceiver subsystem (FBTS) 385. Femto base station controllers and femto base transceiver subsystems were described previously in connection with FIG. 1. FBTS 385 also includes a handoff controller 360. The embodiment of the handoff controller 360 and memory 370 included within FBTS 385 is for illustration only. Handoff controller 360 and memory 370 can be located in other portions of FBS 105 without departing from the scope of this disclosure.

FBSC 380 includes processing circuitry and memory capable of executing an operating program that controls the overall operation of FBTS 385. Under normal conditions, FBSC 380 directs the operation of channel controller 335, which contains a number of channel elements, including channel element 340, that perform bi-directional communications in the forward channels and the reverse channels. A forward channel refers to a channel in which signals are transmitted from the femto base station to the mobile station. A reverse channel refers to a channel in which signals are transmitted from the mobile station to the femto base station. Transceiver IF 345 transfers the bi-directional channel signals between channel controller 340 and RF transceiver unit 350.

Antenna array 355 transmits forward channel signals received from RF transceiver unit 350 to mobile stations in the coverage area of FBS 105. Antenna array 355 also sends to transceiver 350 reverse channel signals received from mobile stations in the coverage area of FBS 105. In a preferred embodiment of the present disclosure, antenna array 355 is a multi-sector antenna, such as a three-sector antenna in which each antenna sector is responsible for transmitting and receiving in a 120° arc of coverage area. Additionally, RF transceiver 350 may contain an antenna selection unit to select among different antennas in antenna array 355 during transmit and receive operations.

According to an exemplary embodiment of the present disclosure, handoff controller 360 is capable of determining a list of candidate target base stations for handoff. Handoff controller 360 is configured to dynamically adjust a threshold parameter used in inter-frequency (i.e., different frequency) hard handoffs. Handoff controller 360 also is configured to dynamically adjust the threshold parameter used in intra-frequency (i.e., same frequency) hard handoffs. Handoff controller 360 is operable to store the threshold parameters and list of candidate target base stations in a memory 370.

Memory 370 can be any computer readable medium, for example, the memory 370 can be any electronic, magnetic, electromagnetic, optical, electro-optical, electro-mechanical, and/or other physical device that can contain, store, communicate, propagate, or transmit a computer program, software, firmware, or data for use by the microprocessor or other computer-related system or method. Memory 370 comprises a random access memory (RAM) and another part of memory 370 comprises a Flash memory, which acts as a read-only memory (ROM). In some embodiments, memory 370 includes a CSG ID 375 that indicates an identity of FBS 105, that FBS 105 is a closed subscriber group femto base station, or both.

Figure 4:
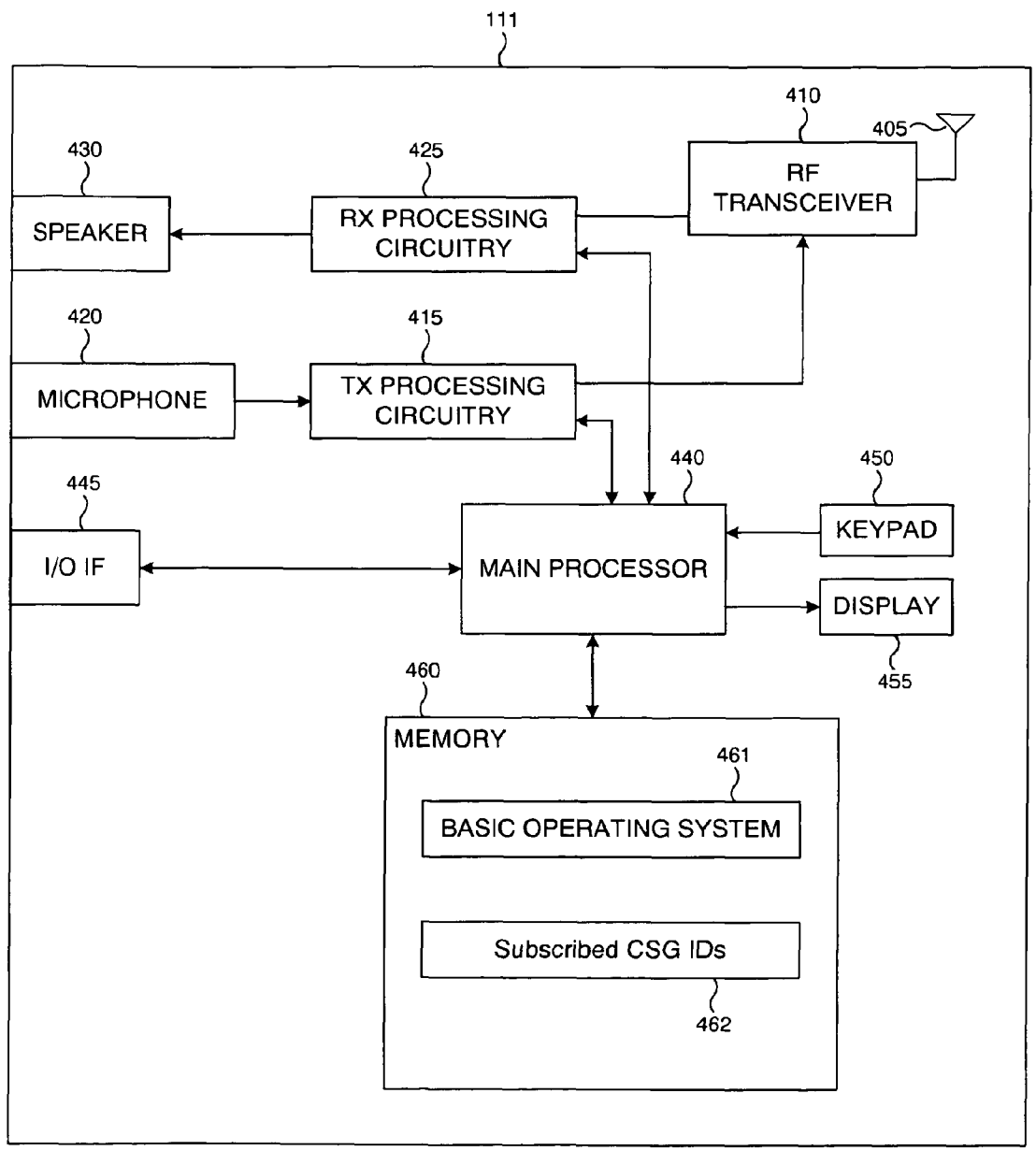
FIG. 4 illustrates wireless mobile station 111 according to embodiments of the present disclosure.

FIG. 4 illustrates wireless mobile station 111 according to embodiments of the present disclosure. The embodiment of wireless mobile station 111 illustrated in FIG. 4 is for illustration only. Other embodiments of the wireless mobile station 111 could be used without departing from the scope of this disclosure. It will be understood that although MS 111 is described for illustration and example only, descriptions can apply to MS 112-116 equally.

Wireless mobile station 111 includes antenna 405, radio frequency (RF) transceiver 410, transmit (TX) processing circuitry 415, microphone 420, and receive (RX) processing circuitry 425. MS 111 also includes speaker 430, main processor 440, input/output (I/O) interface (IF) 445, keypad 450, display 455, and memory 460. Memory 460 further includes basic operating system (OS) program 461 and a plurality of CSG IDs 462.

Radio frequency (RF) transceiver 410 receives from antenna 405 an incoming RF signal transmitted by a base station (e.g., either a base station or femto base station) of wireless network 100. Radio frequency (RF) transceiver 410 down-converts the incoming RF signal to produce an intermediate frequency (IF) or a baseband signal. The IF or baseband signal is sent to receiver (RX) processing circuitry 425 that produces a processed baseband signal by filtering, decoding, and/or digitizing the baseband or IF signal. Receiver (RX) processing circuitry 425 transmits the processed baseband signal to speaker 430 (i.e., voice data) or to main processor 440 for further processing (e.g., web browsing).

Transmitter (TX) processing circuitry 415 receives analog or digital voice data from microphone 420 or other outgoing baseband data (e.g., web data, e-mail, interactive video game data) from main processor 440. Transmitter (TX) processing circuitry 415 encodes, multiplexes, and/or digitizes the outgoing baseband data to produce a processed baseband or IF signal. Radio frequency (RF) transceiver 410 receives the outgoing processed baseband or IF signal from transmitter (TX) processing circuitry 415. Radio frequency (RF) transceiver 410 up-converts the baseband or IF signal to a radio frequency (RF) signal that is transmitted via antenna 405.

In some embodiments of the present disclosure, main processor 440 is a microprocessor or microcontroller. Memory 460 is coupled to main processor 440. According to some embodiments, part of memory 460 comprises a random access memory (RAM) and another part of memory 460 comprises a Flash memory, which acts as a read-only memory (ROM).

Main processor 440 executes basic operating system (OS) program 461 stored in memory 460 in order to control the overall operation of wireless mobile station 111. In one such operation, main processor 440 controls the reception of forward channel signals and the transmission of reverse channel signals by radio frequency (RF) transceiver 410, receiver (RX) processing circuitry 425, and transmitter (TX) processing circuitry 415, in accordance with well-known principles.

Main processor 440 is capable of executing other processes and programs resident in memory 460. Main processor 340 can move data into or out of memory 460, as required by an executing process. Main processor 440 is also coupled to I/O interface 445. I/O interface 445 provides mobile station 111 with the ability to connect to other devices such as laptop computers and handheld computers. I/O interface 445 is the communication path between these accessories and main controller 440.

Main processor 440 is also coupled to keypad 450 and display unit 455. The operator of mobile station 111 uses keypad 450 to enter data into mobile station 111. Display 455 may be a liquid crystal display capable of rendering text and/or at least limited graphics from web sites. Alternate embodiments may use other types of displays.

Main processor 440 is configured to utilize thresholds received from an FBS, e.g., FBS 105, to assist in performing a hard handoff. Main processor 105 is configured to execute a plurality of instructions in memory 460 to determine when conditions are such that a handoff should be or can be performed.

Main processor 440 further is configured to store one or more CSG IDs 462 for use in accessing closed FAPs. When a user (e.g., subscriber) subscribes to a FAP service, the user is provided with one or more CSG IDs 462 in order to access one or more respective FBSs. In some embodiments, the user's wireless device (e.g., MS 111) receives the CSG IDs 462 wirelessly via one or more of the wireless connections between the MS and a BS and the MS and another FBS. In some embodiments, the user enters the CSG IDs 462 into the wireless device (e.g., MS 111) using one or more of I/O IF 445, keypad 450 and display 455. Furthermore, the user can subscribe to multiple closed FAPs and, thus, receive and store multiple CSG ID's 462 corresponding to the various closed FAPs to which subscriptions have been obtained.

In some embodiments, main processor 440 is configured to operate as a CRC examiner. In such embodiments, the main processor 440 is configured to judge whether a remainder (e.g., a mask discussed in further detail herein below) of the CRC decoding matches the base station identifier and closed subscriber group identifier (CSG ID).

Figure 5:
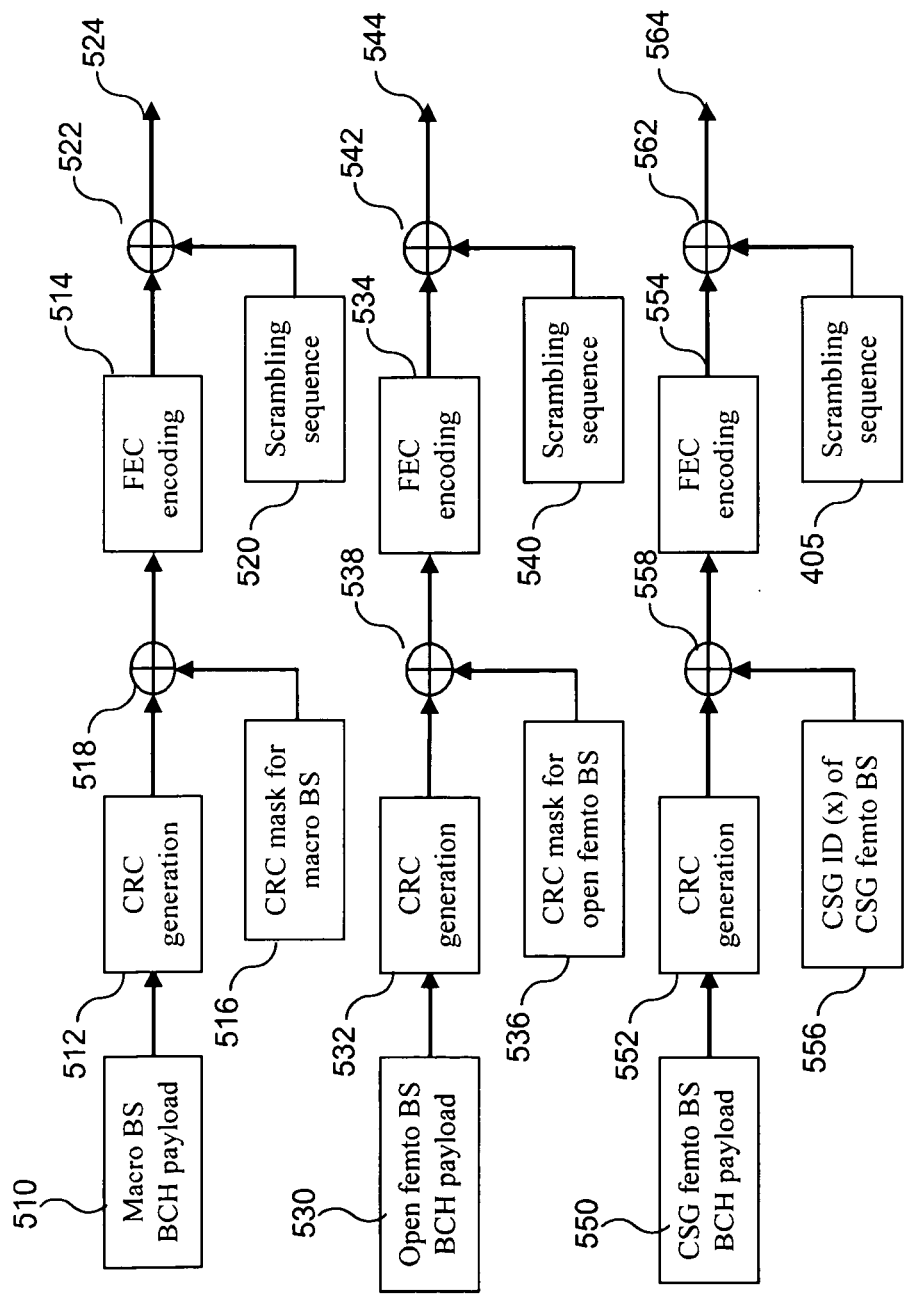
FIG. 5 illustrates example processing at base stations using different CRC masks to distinguish different base stations.

FIG. 5 illustrates example processing using different CRCs to distinguish different base stations. The embodiment of the processing 500 shown in FIG. 5 is for illustration only. Other embodiments could be used without departing from the scope of this disclosure.

In some embodiments, FBS 105 is a CSG base station. FBS 105 applies its CSG ID, or a sequence generated from CSG ID, as a Cyclic Redundancy Check (CRC) mask to the CRC of the Broadcast Channel (BCH) of the FBS 105. In applying the CRC mask to the CRC, FBS 105 combines the CRC mask in an XOR operation with the CRC.

The Broadcast Channel is the control channel on which a base station broadcasts some of its most important system information. For example, in an OFDM based multiple-input-multiple-output (MIMO) wireless system, the BCH often carries information about system bandwidth, antenna configuration, configuration of other control channels, and other critical system configurations. A mobile station needs to correctly detect the BCH of a base station in order to establish further communication with that base station. It will be understood that the BCH may be referred to as different channels in different systems.

In some embodiments, different CRC masks are applied to the BCH of different base stations. For example, BS 101 is a macro base station, FBS 106 is an open-access femto base station, while FBS 105 is a CSG femto base station.

BS 101 transmits a BCH payload 510. The BCH payload 510 is protected by a CRC 512 before the forward-error-correction (FEC) encoding 514. The CRC 512 of the BCH is calculated based on the BCH payload 510 and can be used for error detection of the BCH at the receiver. BS 101 applies a CRC mask 516 for a macro base station to the CRC 512 of the BCH. BS 101 applies the CRC mask 516 by performing an XOR operation 518 with the CRC 512. Thereafter, a scrambling sequence 520 applied by an XOR operation 522 and the signal is transmitted on the BCH.

Additionally, FBS 106, e.g., the open-access femto base station, transmits a BCH payload 530. The BCH payload 530 is protected by a CRC 532 before the FEC encoding 534. The CRC 532 of the BCH is calculated based on the BCH payload 530 and can be used for error detection of the BCH at the receiver. FBS 106 applies a CRC mask 536 for an open-access femto base station to the CRC 532 of the BCH. FBS 106 applies the CRC mask 536 by performing an XOR operation 538 with the CRC 532. Thereafter, a scrambling sequence 540 applied by an XOR operation 542 and the signal is transmitted on the BCH.

Furthermore, FBS 105, e.g., the CSG femto base station, transmits a BCH payload 550. The BCH payload 550 is protected by a CRC 552 before the FEC encoding 554. The CRC 552 of the BCH is calculated based on the BCH payload 550 and can be used for error detection of the BCH at the receiver. FBS 105 applies its CSG ID (x) 556 as the CRC mask to the CRC of the BCH of the CSG femto base station. FBS 105 applies the CSG ID (x) 556 by performing an XOR operation 558 with the CRC 552. Thereafter, a scrambling sequence 560 applied by an XOR operation 562 and the signal is transmitted on the BCH.

Figure 6:
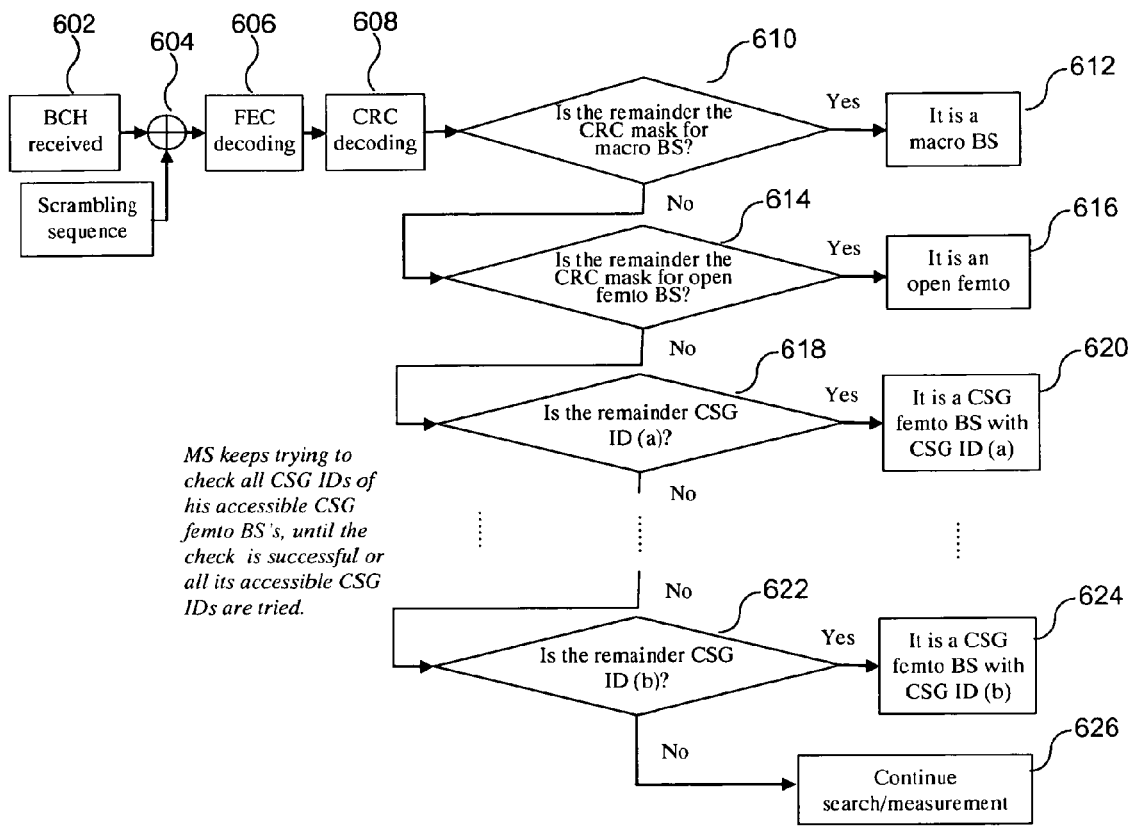
FIG. 6 illustrates a decoding operation by a mobile station using different CRCs to distinguish different base stations and accessibility according to embodiments of the present disclosure.

FIG. 6 illustrates a decoding operation by a mobile station using different CRCs to distinguish different base stations according to embodiments of the present disclosure. The embodiment of the decoding operation 600 shown in FIG. 6 is for illustration only. Other embodiments could be used without departing from the scope of this disclosure.

The mobile station, e.g., MS 116 for example purposes, receives the BCH transmission in step 602. MS 116 removes the applied scrambling sequence by performing an XOR operation in step 604 on the received BCH (from step 602) using a scrambling sequence. MS 116 performs FEC decoding in step 606 and CRC decoding in step 608. Then, a crc examiner in the MS 116 identifies a remainder resulting from the CRC decoder and proceeds to step 610.

In step 610, MS 116 determines if the remainder is the CRC mask for a macro base station. If MS 116 determines that the remainder is the CRC mask for BS 101, then MS 116 identifies the target base station as the macro BS 101 in step 612. MS 116 communicates to its serving base station e.g., BS 103, regarding the signals received from BS 101. Thereafter, BS 103 can initiate a handoff of MS 116 to BS 101. If MS 116 determines that the remainder is not the CRC mask for a macro base station, then the operation proceeds to step 614.

In step 614, MS 116 determines if the remainder is the CRC mask for the open access femto BS. If MS 116 determines that the remainder is the CRC mask for FBS 106 (e.g., the open-access femto BS), then MS 116 identifies the target base station is the open-access femto BS, FBS 106, in step 616. MS 116 communicates to its serving base station e.g., BS 103, regarding the signals received from FBS 106. Thereafter, BS 103 can initiate a handoff of MS 116 to FBS 106. If MS 116 determines that the remainder is not the CRC mask for an open-access femto base station, then the operation proceeds to step 618.

In step 618, MS 116 determines if the remainder is a CSG ID for a CSG FBS that corresponds with an accessible CSG FBS (e.g., a CSG FBS to which MS 116 is allowed access). MS 116 compares the remainder with the CSG IDs stored in MS 116 (e.g., in a list of CSG IDs 462 stored in memory 460 discussed in further detail herein above with respect to FIG. 4). If MS 116 determines that the remainder is one of the CSG IDs in the list of the accessible CSG IDs of MS 116, then MS 116 identifies that the base station is a CSG femto BS with CSG ID same as the remainder in step 620. For example, MS 116 can identify the base station as FBS 105. MS 116 communicates to its serving base station e.g., BS 103, regarding the signals received from FBS 105. Thereafter, BS 103 can initiate a handoff of MS 116 to FBS 105. Additionally, if MS 116 determines that the remainder is not the CRC mask for FBS 105, then, in step 622 MS 116 continues to check the remainder with all CSG IDs of its accessible CSG femto BS's, until the check is successful and a CSG femto BS is identified in step 624 or all accessible CSG IDs stored in MS 116 are checked. In the event that MS 116 is unable to match the remainder with a CSG ID stored in memory, then MS 116 will continue to search and measure signals received in step 626.

Accordingly, in such embodiments, the CSG ID of a closed-subscriber-group communication base station is indicated in the CRC mask of the CRC functionality utilized in protecting the BCH of the base station. Therefore no additional payload bits in BCH are needed for the indication of CSG ID.

In some embodiments, the CRC mask for BS 101 is reserved as a sequence of all zeros, and an open CSG ID is reserved for FBS 106 (e.g., for open-access femto base stations). With a sequence of all zeros as the CRC mask, BS 101 operations remain unchanged compared a system without femtocells. For example, BS 101 operations are the same as the one without CRC mask, and the FBS's will have the CRC masks depending on FBS access modes and a CSG ID, if the FBS's are CSG FBSs.

Figure 7:
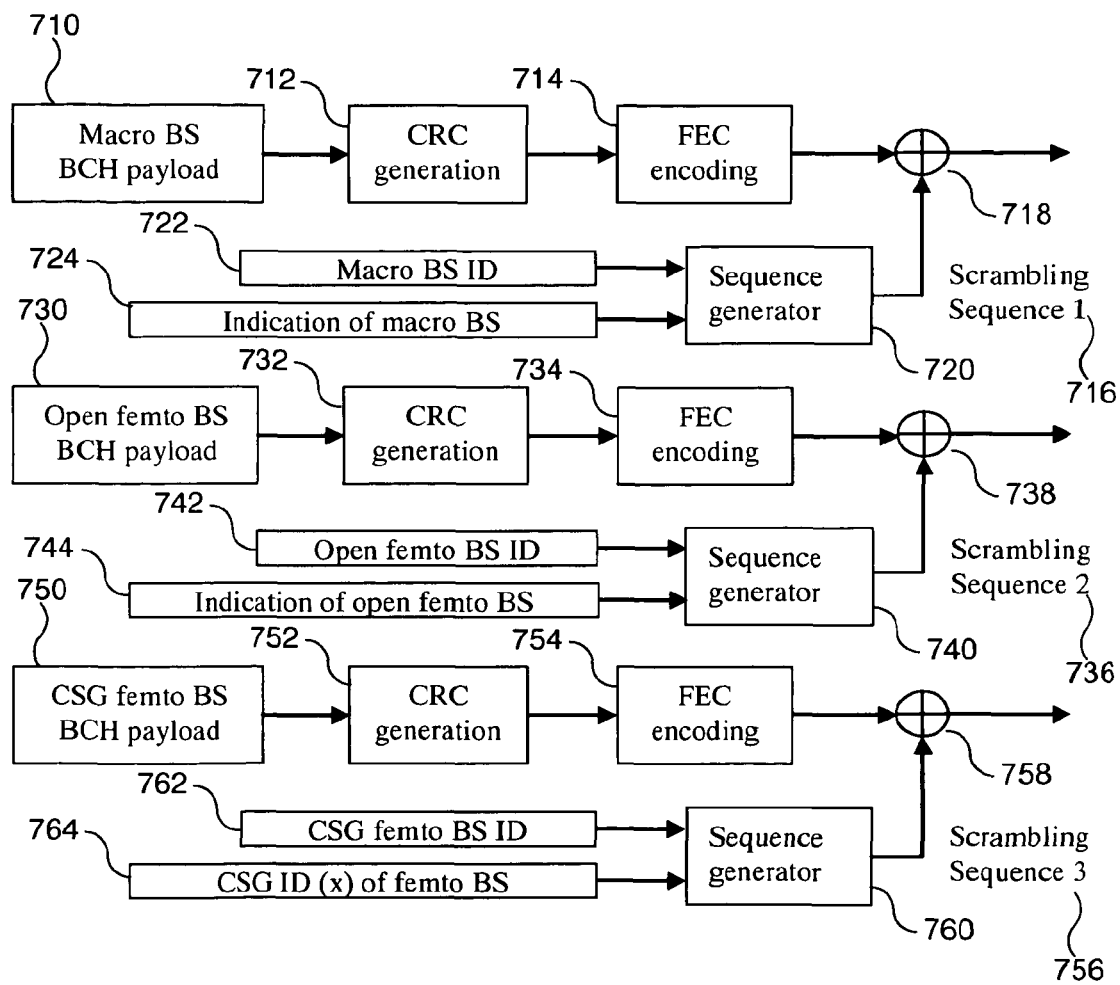
FIG. 7 illustrates example processing at base stations using different scrambling sequences to distinguish different base stations according to embodiments of the present disclosure.

FIG. 7 illustrates example processing using different scrambling sequences to distinguish different base stations. The embodiment of the processing 700 shown in FIG. 7 is for illustration only. Other embodiments could be used without departing from the scope of this disclosure.

In some embodiments, FBS 105 (e.g., a closed subscriber group (CSG) base station) generates scrambling sequence using its CSG ID or a sequence generated from the CSG ID. As a result, the scrambling sequence generated by FBS 105 is different from the scrambling sequences of other base stations such as, but not limited to, BS 101, BS 102, BS 103, FBS 104 and FBS 106. In some embodiments, the scrambling sequence is optionally generated using the preamble sequence of the base station or the base station ID, in addition to the CSG ID as the input of the scrambling sequence.

The preamble sequence is a sequence carried on a preamble that is transmitted by a base station and used by a mobile station to perform time and frequency synchronization with that base station. The preamble sequence often is determined by and shorter than the base station identification (BS ID) which can be an identifier of base station globally. The preamble sequence usually is unique within an area and reused in other areas. Once a mobile station acquires the preamble of a base station, the mobile station can identify the base station and locally attempt a decoding of the BCH of that base station in order to learn more about the configuration of that base station.

For example, there can be a any-to-one correspondence between preamble sequence and the BS ID, and one-to-one correspondence if the preamble sequences can be of enough number. Furthermore, the preamble may be referred to as different channels in different systems, such as synchronization channel, primary synchronization channel and secondary synchronization channel, and the like.

As illustrated in FIG. 7, the scrambling sequence is combined in an XOR operation with the encoded bit stream of the BCH. For example, BS 101 is a macro base station, FBS 106 is an open-access femto base station, while FBS 105 is a CSG femto base station.

BS 101 generates a scrambling sequence by using an indication of a macro base station and a macro base station ID for BS 101. BS 101 prepares a BCH payload 710 for transmission. BS 101 then applies CRC generation 712 and FEC coding 714 to the BCH payload 710. Thereafter, BS 101 applies a first scrambling sequence 716 to the BCH payload 710 by performing an XOR operation 718. The first scrambling sequence 716 is generated by a sequence generator block 720 located in BS 101. For example, sequence generator block 720 can be located in transceiver 250 discussed herein above with respect to FIG. 2. The sequence generator block 720 uses a macro BS ID 722 for BS 101 and a first value 724 that provides an indication of a macro BS to generate the first scrambling sequence 716. The first value 724 can be, but is not limited to, an indicator stored in memory 270. In some such embodiments, the first scrambling sequence 716, using the macro BS ID 722 for BS 101 and first value 724 is uniquely associated to BS 101.

FBS 106 generates a scrambling sequence by using an indication of a femtocell base station and a femtocell base station ID for FBS 106. FBS 106 prepares a BCH payload 730 for transmission. FBS 106 then applies CRC generation 732 and FEC coding 734 to the BCH payload 730. Thereafter, FBS 106 applies a second scrambling sequence 736 to the BCH payload 730 by performing an XOR operation 738. The second scrambling sequence 736 is generated by a sequence generator block 740 located in FBS 106. For example, sequence generator block 740 can be located in transceiver 350 discussed herein above with respect to FIG. 3. The sequence generator block 740 uses an Open femto base station ID 742 for FBS 106 and a second value 744 configured to provide an indication of an open-access femto base station. The second value 744 can be, but is not limited to, an indicator stored in memory 370. In some such embodiments, the second scrambling sequence 736, using the Open femto base station ID 742 for FBS 106 and second value 744 is uniquely associated to FBS 106.

FBS 105 generates a scrambling sequence by using an indication of a femtocell base station and a femtocell base station ID for FBS 106. FBS 105 prepares a BCH payload 750 for transmission. FBS 105 then applies CRC generation 752 and FEC coding 754 to the BCH payload 750. Thereafter, FBS 105 applies a third scrambling sequence 756 to the BCH payload 750 by performing an XOR operation 758. The third scrambling sequence 756 is generated by a sequence generator block 760 located in FBS 105. For example, sequence generator block 740 can be located in transceiver 350 discussed herein above with respect to FIG. 3. The sequence generator block 760 uses a CSG BS ID 762 for FBS 105 and a CSG ID (x) 764 for FBS 105. In some such embodiments, the third scrambling sequence 756, using the CSG BS ID 762 for FBS 105 and the CSG ID (x) 764 for FBS 105 is uniquely associated to FBS 105.

In some embodiments, the base station IDs 722, 742, 762 used in the scrambling sequence generator are optional (i.e., the base station IDs may not be used in generating the scrambling sequences). The CRC and FEC are used to protect the BCH.

It will be understood that other types of communication stations can be used without departing from the scope of this disclosure. For example, the first base station, BS 101, can be a relay base station and the second base station, previously FBS 106 in the above example, can be a macro base station, such as BS 102.

Figure 8:
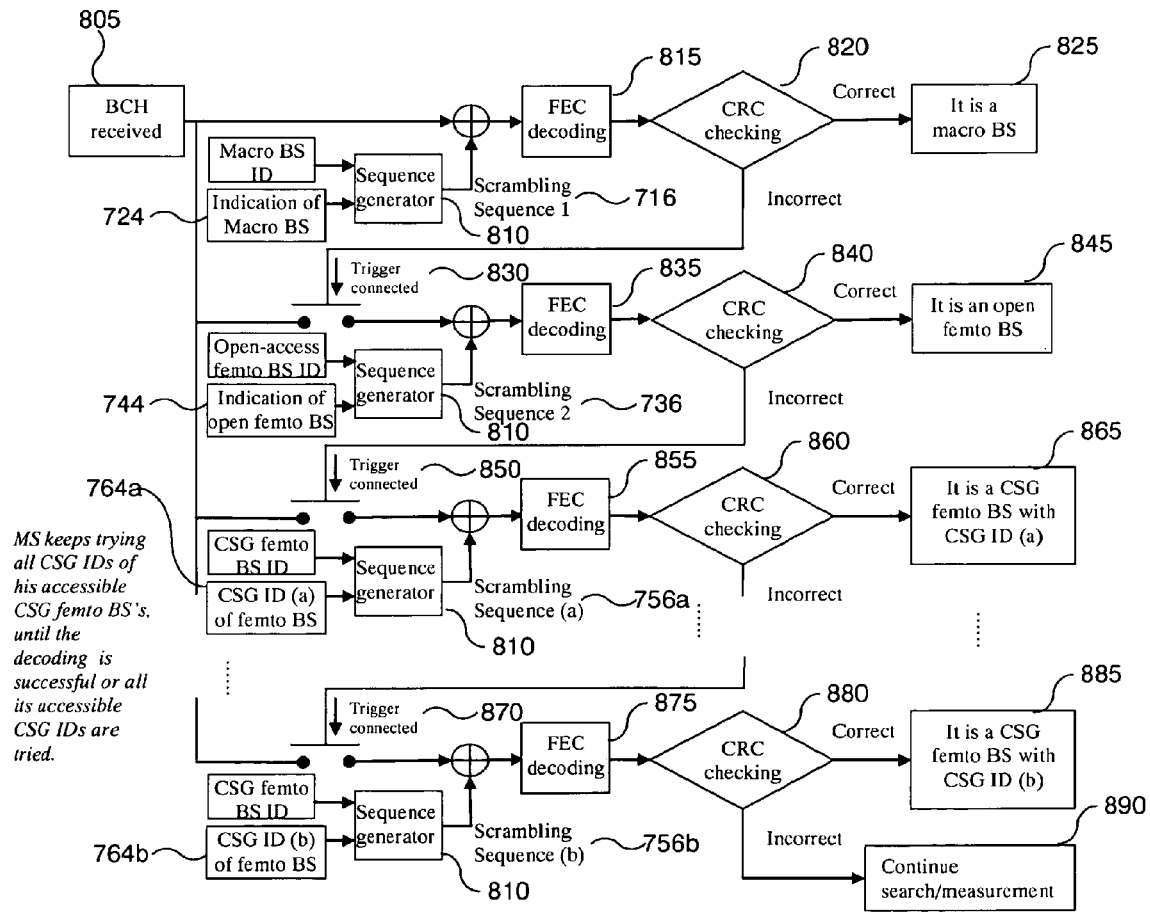
FIG. 8 illustrates a decoding operation by a mobile station using different scrambling sequences to distinguish different base stations and accessibility according to embodiments of the present disclosure.

FIG. 8 illustrates a decoding operation by a mobile station using different scrambling sequences to distinguish different base stations according to embodiments of the present disclosure. The embodiment of the decoding operation 800 shown in FIG. 8 is for illustration only. Other embodiments could be used without departing from the scope of this disclosure.

In some embodiments, MS 116 receives the BCH in step 805. MS 116 attempts to decode the BCH assuming the BCH is from BS 101, e.g., a macro BS, first. MS 116 uses the first scrambling sequence 716 generated by generator block 810 using first value 724 (e.g., the indication of the macro BS). For example, sequence generator block 810 can be located a plurality of instructions located in memory 460 configured to cause main processor 440, discussed herein above with respect to FIG. 4, to perform sequence generation. If the decoding 815 is successful and MS 116 determines that the CRC checks right in step 820, then MS 116 identifies, in step 825, that the transmissions are received from BS 101, which is a macro BS.

In the event that MS 116 determines that the CRC is incorrect in step 820, then in step 830, MS 116 attempts decoding the BCH assuming the BCH is from an open-access femto BS. As such, the sequence generator block 805 uses the second scrambling sequence 736 generated by using the second value 744 (e.g., indication of the open-access femto BS). If the decoding in step 835 is successful and MS 116 determines that the CRC checks right in step 840, then MS 116 identifies, in step 845, that the transmissions are received from FBS 106, which is an open-access femto BS.

In the event that MS 116 determines that the CRC is incorrect in step 840, then in step 850, MS 116 attempts decoding the BCH assuming the BCH is from a CSG femto BS with CSG ID (a) 764*a*. CSG ID (a) 764*a* is selected from the list of accessible CSG IDs 462 stored in MS 116. The sequence generator block 805 uses CSG ID (a) 764*a* to generate the third scrambling sequence (a) 756*a*. In the event that the decoding in step 855 is successful and MS 116 determines that the CRC checks right in step 860, MS 116 identifies in step 865 that the transmissions are from FBS 105, which is a CSG femto BS with CSG ID (a) 764*a*.

In the event that In the event that MS 116 determines that the CRC is incorrect in step 860, then in step 870, MS 116 attempts decoding the BCH assuming the BCH is from a CSG femto BS with CSG ID (b) 764*b*. CSG ID (b) 764*b* is selected from the list of accessible CSG IDs 462 stored in MS 116. The sequence generator block 805 uses CSG ID (b) 764*b* to generate the third scrambling sequence (b) 756*b*. In the event that the decoding in step 875 is successful and MS 116 determines that the CRC checks right in step 880, MS 116 identifies in step 885 that the transmissions are from another FBS (not specifically illustrated), which is a CSG femto BS with CSG ID (b) 764*b*.

Otherwise, in step 890, MS 116 will continue to pick up another CSG ID in the list of his accessible CSG IDs 462, until the decoding is successful or the list of his accessible CSG IDs is exhausted. Thereafter, MS 116 continues the search/measurement process.

In some embodiments, the CSG ID of a closed-subscriber-group communication base station can be indicated in the CRC mask of the CRC functionality used in protecting BCH of the base station. Therefore, no additional payload bits in BCH are required for the indication of CSG ID.

In some embodiments, the BS ID or value indicating the type of BS (e.g., first value 724, second value 744 or CSG ID (x) 764) is in larger length than the CRC or scrambling sequence used.

In such embodiments, the base stations, e.g., one or more of BS 101-103 and/or FBS 104-106 is configured to use a CRC with larger length to match up the length of the BS ID (or other value such as CSG ID), or alternatively use the full size of the CRC and apply a remainder of the BS ID (or other value) in the BCH payload. For example, the CRC can be sixteen (16) bits while the BS ID is twenty four (24) bits. FBS 105 changes its CRC from 16 bits to 24 bits by taking 8 bits from payload, or FBS 105 uses sixteen bits of the BS ID as the CRC mask and inserts the remaining eight bits in the BCH payload. For the latter example, when MS 116 receives and decodes the BCH, MS 116 identifies the sixteen bits and remainder (i.e., the eight bits) in the BCH payload. MS 116 is configured to assemble the sixteen bits used in the CRC mask with the remainder in order to obtain the BS ID for FBS 105.

As extensions of the aforementioned embodiments, the methods mentioned above can be combined, and the methods mentioned above can be combined with other methods of identifying base stations.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. For use in a wireless communications network, a mobile station capable of communicating with a plurality of different type base stations, the mobile station comprising:
   a receiver configured to receive a broadcast channel communication from a base station, the broadcast channel communication comprising a cyclic redundancy check (CRC) masked with a femtocell base station identifier; and
   a processor configured to:
      extract the femtocell base station identifier by unmasking the broadcast channel communication; and
      distinguish a type of the base station by comparing the femtocell base station identifier with identifiers of the plurality of different type base stations comprising a macro type base station and a femtocell type base station, until the femtocell base station identifier matches one of the identifiers of the plurality of different type base stations.

2. The mobile station as set forth in claim 1, wherein the femtocell base station identifier is a closed subscription group identifier associated with one or more femtocell base stations.

3. The mobile station as set forth in claim 1, further comprising a memory configured to store at least one closed subscription group identifier.

4. The mobile station as set forth in claim 3, further comprising:
   a CRC examiner configured to judge whether a remainder of the CRC decoding matches the femtocell base station identifier and a closed subscriber group identifier (CSG ID);
   a scrambling sequence generator configured to generate a number of scrambling sequences based on respective values stored in the memory, the values corresponding to a least one of an indication of the macro base station, and indication of an open-based femtocell base station, and a closed subscription group identifier (CSG ID).

5. The mobile station as set forth in claim 1, wherein the femtocell base station identifier comprises a first portion extracted from the CRC mask and a remainder portion retrieved from a payload of the broadcast channel communication.

6. The mobile station as set forth in claim 1, wherein the main processor further is configured to use the femtocell base station identifier to determine if the femtocell base station is one of a macro base station, relay station, an open-access femtocell base station and a closed subscription group femtocell base station.

7. The mobile station as set forth in claim 1, wherein the mobile station initiates a handoff process in response to a determination that the mobile station is authorized to access the at least one of the plurality of different type base stations.

8. For use in a wireless communication system, a method for distinguishing between macro base stations and femtocell base stations comprising:
   applying a femtocell base station identification indicating an identity of the femtocell base station as a cyclic redundancy check (CRC) mask to a broadcast channel communication; and
   transmitting the broadcast channel communication to a mobile station,
   wherein the femtocell base station identification is extracted, by the mobile station, by unmasking the broadcast channel communication, and is used to distinguish, by the mobile station, a type of the base station by comparing the extracted femtocell base station identification with identifiers of a plurality of different type base stations comprising a macro type base station and a femtocell type base station, until the femtocell base station identifier matches one of the identifiers of the plurality of different type base stations.

9. The method as set forth in claim 8, wherein the step of applying further comprises exclusive-ORing (XORing) the BS ID with the broadcast channel communication.

10. The method as set forth in claim 8, wherein the femtocell base station identification is a closed subscription group identifier (CSG ID) value.

11. The method as set forth in claim 8, wherein applying comprises applying a first portion of the femtocell base station identification as the CRC mask to the CRC of the broadcast channel communication; and wherein transmitting further comprises transmitting a second portion of the femtocell base station identification in a payload of the broadcast communication.

12. For use in a wireless communications network, a femtocell base station capable of communicating with a plurality of mobile stations, the base station comprising:
   a processor configured to apply a closed subscription group identifier of the femtocell, as a cyclic redundancy check (CRC) mask to a broadcast channel communication; and
   a transmitter configured to transmit the broadcast channel communication to a mobile station,
   wherein the closed subscription group identifier is extracted, by the mobile station, by unmasking the broadcast channel communication, and is used to distinguish, by the mobile station, a type of the base station by comparing the extracted closed subscription group identifier with identifiers of a plurality of different type base stations comprising a macro type base station and a femtocell type base station, until the closed subscription group identifier matches one of the identifiers of the plurality of different type base stations.

13. The femtocell base station as set forth in claim 12, wherein the closed subscription group identifier comprises a first portion applied as the CRC mask and a remainder portion transmitted in a payload of the broadcast channel communication.

14. The femtocell base station as set forth in claim 12, wherein the femtocell base station further comprising a scrambling sequence generator configured to use the closed subscription group identifier to generate the scrambling sequence generator.

15. For use in a wireless communications network, a method for communicating with a plurality of different type base stations, the method comprising:
- receiving a broadcast channel communication from a base station, the broadcast channel communication comprising a cyclic redundancy check (CRC) masked with a femtocell base station identifier; and
- extracting the base station identifier by unmasking the broadcast channel communication using a femtocell base station identifier as a CRC mask; and
- distinguishing a type of the base station by comparing the base station identifier with identifiers of the plurality of different type base stations comprising a macro type base station and a femtocell type base station, until the femtocell base station identifier matches one of the identifiers of the plurality of different type base stations.

16. The method as set forth in claim 15, wherein the base station identifier is a closed subscription group identifier associated with one or more femtocell base stations.

17. The method as set forth in claim 15, further comprising storing at least one closed subscription group identifier.

18. The method as set forth in claim 17, further comprising judging whether a remainder of the CRC decoding matches the base station identifier and a closed subscriber group identifier (CSG ID).

19. The method as set forth in claim 15, wherein the femtocell base station identifier comprises a first portion extracted from the CRC mask and a remainder portion retrieved from a payload of the broadcast channel communication.

20. The method as set forth in claim 15, further comprising using the femtocell base station identifier to determine if the femtocell base station is one of a relay station, an open-access femtocell base station and a closed subscription group femtocell base station.

21. The method as set forth in claim 15, further comprising initiating a handoff process in response to a determination that the mobile station is authorized to access the at least one of the plurality of different type base stations.

* * * * *